United States Patent
Swenson et al.

(10) Patent No.: US 7,241,669 B2
(45) Date of Patent: Jul. 10, 2007

(54) METHOD OF FORMING A SCRIBE LINE ON A PASSIVE ELECTRONIC COMPONENT SUBSTRATE

(75) Inventors: Edward J. Swenson, Portland, OR (US); Yunlong Sun, Beaverton, OR (US); Manoj Kumar Sammi, Beaverton, OR (US); Jay Christopher Johnson, Portland, OR (US); Doug Garcia, Beaverton, OR (US); Rupendra M. Anklekar, Portland, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 205 days.

(21) Appl. No.: 10/887,662

(22) Filed: Jul. 9, 2004

(65) Prior Publication Data

US 2005/0042805 A1 Feb. 24, 2005

Related U.S. Application Data

(63) Continuation-in-part of application No. 10/618,377, filed on Jul. 11, 2003, now Pat. No. 6,949,449.

(51) Int. Cl.
*H01L 21/00* (2006.01)

(52) U.S. Cl. ............... 438/463; 438/460; 438/462; 438/464; 438/940; 219/121.67

(58) Field of Classification Search ........... 438/460, 438/462–464, 940; 219/121.67
See application file for complete search history.

(56) References Cited

U.S. PATENT DOCUMENTS 5,961,852 A 10/1999 Rafla-Yuan et al. ..... 219/21.69

(Continued)

FOREIGN PATENT DOCUMENTS

| WO | WO 02024395 | 3/2002 |
| WO | WO 02060636 | 8/2002 |
| WO | WO 03002289 | 1/2003 |

OTHER PUBLICATIONS

Park, Jongkook and Sercel, Patrick, "High-speed UV laser scribing boosts blue LED industry," Compoundsemiconductor.net magazine, posted on Dec. 2002 (available at www.compoundsemiconductor.net/magazine/article/8/12/3/1) (last visited Jul. 10, 2003).

D. H. Schroeder and F. L. English, "A Comparison of the Strength of Alumina Substrates for Different Separation Techniques," from 1972 Components Conference Proceedings, Microcircuit Technology Division, pp. 412-415.

*Primary Examiner*—Zandra V Smith
*Assistant Examiner*—Christy Novacek
(74) *Attorney, Agent, or Firm*—Stoel Rives LLP

(57) ABSTRACT

A method of forming a scribe line having a sharp snap line entails directing a UV laser beam along a ceramic or ceramic-like substrate such that a portion of the thickness of the substrate is removed. The UV laser beam forms a scribe line in the substrate without appreciable substrate melting so that a clearly defined snap line forms a region of high stress concentration extending into the thickness of the substrate. Consequently, multiple depthwise cracks propagate into the thickness of the substrate in the region of high stress concentration in response to a breakage force applied to either side of the scribe line to effect clean fracture of the substrate into separate circuit components. The formation of this region facilitates higher precision fracture of the substrate while maintaining the integrity of the interior structure of each component during and after application of the breakage force.

24 Claims, 9 Drawing Sheets

U.S. PATENT DOCUMENTS

| | | |
|---|---|---|
| 6,117,347 A | 9/2000 | Ishida ......................... 216/52 |
| 6,140,603 A | 10/2000 | Hwang et al. ......... 219/121.69 |
| 6,309,943 B1 * | 10/2001 | Glenn et al. ................ 438/401 |
| 6,413,839 B1 | 7/2002 | Brown et al. ................ 438/463 |
| 6,420,245 B1 | 7/2002 | Manor ......................... 438/460 |
| 6,420,776 B1 | 7/2002 | Glenn et al. ................ 257/620 |
| 6,580,054 B1 | 6/2003 | Liu et al. ............... 219/121.68 |
| 6,676,878 B2 * | 1/2004 | O'Brien et al. .............. 264/400 |
| 6,787,732 B1 | 9/2004 | Xuan et al. ............ 219/121.67 |
| 6,788,545 B2 * | 9/2004 | Nakayama ................... 361/752 |
| 2002/0033558 A1 | 3/2002 | Fahey et al. ................. 264/400 |
| 2002/0063361 A1 * | 5/2002 | Fahey ......................... 264/400 |
| 2005/0263854 A1 * | 12/2005 | Shelton et al. .............. 257/615 |

\* cited by examiner

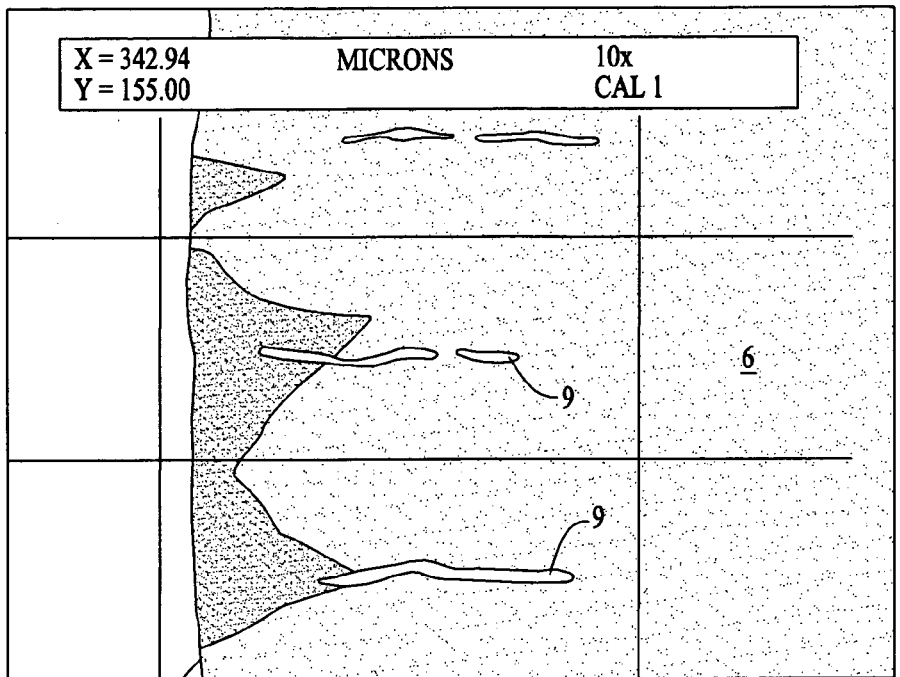
fig. 3A
PRIOR ART
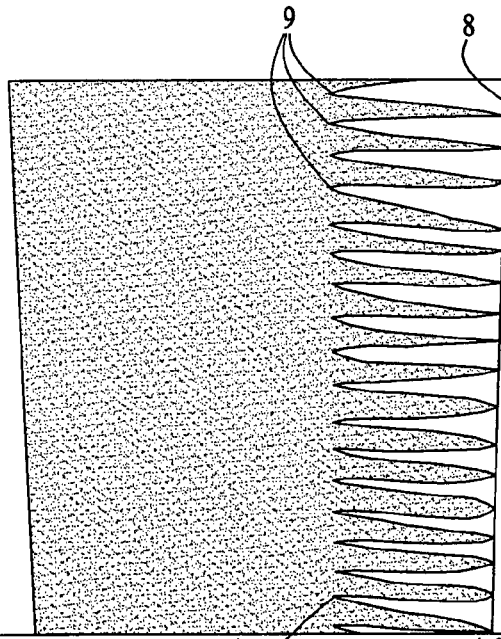
fig. 3B
PRIOR ART
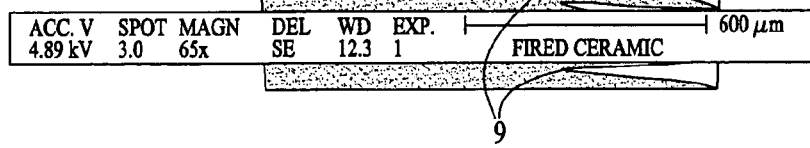

METHOD OF FORMING A SCRIBE LINE ON A PASSIVE ELECTRONIC COMPONENT SUBSTRATE

RELATED APPLICATION

This is a continuation-in-part of U.S. patent application Ser. No. 10/618,377, filed Jul. 11, 2003, now U.S. Pat. No. 6,949,449.

TECHNICAL FIELD

The present invention relates to a method of forming a scribe line in a passive electronic component substrate, and more particularly to a method of using an ultraviolet laser to ablate a passive electronic component substrate and thereby form a scribe line along which the substrate may be broken into multiple pieces.

BACKGROUND OF THE INVENTION

As is well known to those of skill in the art, passive and hybrid microelectronic circuit components (hereinafter circuit "components"), are fabricated in an array on or in the interior of a ceramic substrate. The ceramic substrate is cut, sometimes called diced, to singulate the circuit components from one another.

For the past 30 years, the predominant method of singulating ceramic substrates involved using a pulsed $CO_2$ laser dicing process in which a pulsed laser was aligned with and then directed along a street to form a "post hole" scribe line. FIG. 1 is a scanning electron micrograph (SEM) of a post hole scribe line 2 formed by pulsed $CO_2$ laser cutting. As shown in FIG. 1, post hole scribe line 2 includes spaced-apart vias 4 that extend into the thickness of a ceramic substrate 6 along the length of scribe line 2. Following formation of the post hole scribe line, force is applied to the ceramic substrate portions on either side of the scribe line to effect fracture of the ceramic substrate into separate pieces.

Although pulsed $CO_2$ laser cutting offers advantages in speed, cleanliness, accuracy, and reduced kerf, the use of the post hole scribe line creates separate ceramic pieces having jagged and uneven side edges as well as significant melted slag residue. As shown in the SEM of FIG. 2, ceramic substrate piece 6 formed in accordance with the post hole scribe line method has sinusoidal-shaped side edges 8 rather than the preferred straight and smooth side edges. Further, ceramic substrate piece 6 includes slag residue 7.

Pulsed $CO_2$ laser cutting also leads to distortion of the interior structure of the ceramic surface, resulting in structurally weak components. Specifically, the strength of the ceramic substrate is reduced, decreasing its ability to withstand thermal or mechanical stress. The structural weakness of the interior often evidences itself in an increased number of microcracks present near the laser scribe line. FIGS. 3A and 3B are SEMs showing cross-sections of ceramic substrate pieces formed using pulsed $CO_2$ laser cutting. FIG. 3A shows a ceramic substrate piece at 10× magnification, and FIG. 3B shows the side edge of a ceramic substrate piece at 65× magnification. Both figures show multiple microcracks 9 extending from side edge 8 into the interior of the ceramic substrate piece 6. According to Weibull's strength theory, the flexural strength of the ceramic substrate decreases as the density of microcracks increases (Weibull, W., *Proc. Roy. Swedish Inst. Engrg. Research,* 193.151 (1939)). Manufacturing costs increased because many of the circuit components were discarded as a consequence of their insufficient flexural strength.

Until recently, fired ceramic substrates had length and width dimensions of about 6×8 inches and a thickness of about 1 mm. The uneven side edges, slag residue, and microcracks formed as a result of pulsed $CO_2$ laser cutting were tolerable when scribing ceramic substrates having these specifications.

However, recent technological advances in component miniaturization necessitate singulation of circuit components having length and width dimensions of about 1 mm×0.5 mm (0402) or 0.5 mm×0.25 mm (0201) and a thickness of between about 80 microns and about 300 microns. Circuit components of this density and/or thickness cannot tolerate such uneven side edges, slag residue, and microcracks resulting from either pulsed $CO_2$ or Nd:YAG laser cutting because these methods of laser cutting adversely affect the specified circuit component values and/or subsequent component processing.

One prior art attempt to singulate these smaller and thinner circuit components entailed sawing through the ceramic substrate using a saw blade that had been aligned with a "street" created by the thick and thin film patterns formed on or in the interior of the ceramic substrate as part of the process of forming the circuit components. Alignment of the saw blade and street was achieved using an alignment system. Tape was preferably attached to the ceramic substrate before sawing to provide support for the singulated circuit components upon completion of sawing. Problems with this prior art method include inexact positioning and alignment of the saw blade, mechanical wobbling of the saw blade, and uneven or rough surfaces resulting from the mechanical nature of cutting with a saw blade. Further, the width of the scribe line had to be sufficiently large to accommodate the width of the saw blade. A typical saw blade is 75–150 microns wide along its cutting axis, producing cuts that are about 150 microns wide. Because the resulting scribe lines had relatively large widths and therefore occupied a greater portion of substrate surface, fewer components could be produced for any given size of ceramic substrate. This resulted in more wasted surface area, less surface area available for circuit component parts, and a greater than optimal cost of each circuit component.

The method by which most large-sized chip resistor components are formed involves initially precasting the scribe lines into a ceramic substrate in an unfired state. The resistor components are then printed on the fired ceramic substrate, and the substrate is broken along the scribe lines to form separate circuit components. Due to normal variations in the positional accuracy of the precast scribe lines and unpredictable variation in the amount of ceramic substrate shrinkage during firing, subsequent printing of the resistor components often results in inadequate alignment with the precast scribe lines. This inadequacy of alignment is indirectly proportional to the size of the component parts.

For smaller circuit components, a YAG laser may be used to form the scribe lines in a fired ceramic substrate. These scribe lines are used to align subsequent printing steps. For example, an IR-YAG laser operated at a wavelength of about 1.0 μm can be used to form a scribe line in a ceramic substrate. The method of forming the scribe line involves imparting relative motion between the IR-YAG laser beam and each of the top and bottom surfaces of the ceramic substrate to form trenches in them. When a breakage force is applied to either side of a trench, cracks propagate into the length and thickness of the substrate, resulting in fracture of the ceramic substrate into multiple pieces.

Some drawbacks of using this method include: (1) thermal damage caused by use of an IR-YAG laser results in de-lamination of the metal conductor pads; (2) misalignment of the top and bottom surface scribe lines resulting in non-uniform side margins of the diced ceramic substrate pieces; and (3) inefficiency resulting from the necessary flipping, realigning, and sequential scribing of the top and bottom surfaces and consequent consumption of more than twice the time required to scribe a single surface.

One of the popular scribing methods used in the past has been to first pre-scribe the fired chip resistor ceramic substrates and then align the screen printing of the conductor patterns and resistor patterns to the scribe lines. However, as circuit component size further decreases, aligning the screen printing patterns to the previously formed scribe lines becomes very difficult to accomplish.

It consequently became necessary to form off-axis scribe lines in the printed and fired finished chip resistor pattern. This need was also evident for ceramic components (chip capacitors, conductors, filters, etc.) that had been fired, a process that entails exposing the ceramic substrate to temperatures of between about 750° C. and about 1100° C. Prolonged exposure to these high temperatures causes the ceramic substrates to warp along one or both axis, resulting in the formation of a non-standard shaped ceramic substrate. Thus, a need arose for a laser that could align with and accurately scribe these nonstandard-shaped ceramic substrates to form multiple nominally identical circuit components. Those skilled in the art will understand that the printing and scribing sequence can be interchanged without affecting the end result.

Additionally, many circuit components have a top layer that includes metal. This layer can extend into either or both of the streets extending along the x-axis or the y-axis. Those of ordinary skill will readily recognize that the existence of metal in the top layer prevents the use of a $CO_2$ laser since the metal reflects the $CO_2$ laser beam. Further, mechanically sawing a metal-containing layer is undesirable because the ductile nature of many metals, such as copper, make mechanical sawing of a metal-containing layer an extremely slow and difficult process.

Via drilling using an UV-YAG laser has been used extensively in the printed wiring board (PWB) industry. Specifically, a UV-YAG laser emits a laser beam that cuts through the top, metal-containing layer before the underlying organic material is drilled. Thus UV laser drilling of copper, and other metals used in the fabrication of circuit components, is well understood by those of ordinary skill in the art.

What is needed, therefore, is an economical method of forming in a substrate made of ceramic or ceramic-like material a scribe line that facilitates the clean fracture of the substrate into separate circuit component parts having clearly defined side margins, minimal slag residue, and a reduced incidence of microcracking.

SUMMARY OF THE INVENTION

An object of the present invention is, therefore, to provide a method by which a passive electronic component substrate, on the surface or in the interior of which have been formed multiple evenly-spaced electronic components, may be cleanly singulated into separate circuit components, including, e.g. resistors, capacitors, inductors, filters, varistors, and thermistors.

The method of the present invention entails directing a UV laser beam to form a scribe line along a passive electronic component substrate such that a portion of the thickness of the substrate is removed to form a trench. The trench has a width that converges from the substrate surface to the bottom of the trench to define a sharp snap line.

The term "passive electronic component substrate" is used herein to refer to a single layer structure and consolidated stack, multi-layer, and laminated multi-layer structures. Passive electronic component substrates are of different types including, but not limited to, preferred ceramic and ceramic-like materials described below.

A first type is a ceramic substrate constructed in either single layer or multi-layer plate form. The scribe lines can be formed in green (soft) or fired (hard) plates, including high temperature co-fired ceramic (HTCC) and low temperature co-fired ceramic (LTCC) materials.

A second type is a single layer fired ceramic substrate patterned with individual (chip) resistors, resistor networks, or hybrid resistor networks (i.e., those having more than one sheet resistivity value); piezoelectric, electro-optic, or optoelectronic devices; inductors; or other individual components built on the larger multi-element ceramic substrate.

A third type is implemented with multi-layer ceramic technology, including, for either HTCC or LTCC materials, chip capacitors, chip arrays, networks composed of arrays of multiple component types (e.g., resistors, capacitors, and inductors), and HTCC and LTCC electronic packages containing passive components or electronic packages for use as interposers connecting semiconductor (e.g., silicon) devices to other electronic packages.

A fourth type is a specialized ceramic substrate, either fired or unfired, and of either single layer or multi-layer construction, such as, for example, a substrate of a varistor or a thermistor. Single layer construction of thermistor and varistor substrates is referred by skilled persons to any one of discs, rods, washers, slabs, plates, tubular shapes, and beads.

The UV laser emits a laser beam characterized by an energy and spot size sufficient to form a scribe line in the substrate without appreciable substrate melting so that the clearly defined, sharp snap line forms a region of high stress concentration extending into the thickness of the substrate and along the length of the snap line. Consequently, multiple depthwise cracks propagate into the thickness of the substrate in the region of high stress concentration in response to a breakage force applied to either side of the trench to effect clean fracture of the substrate into separate circuit components having side margins defined by the snap line.

The formation of a region of high stress concentration facilitates higher precision fracture of the substrate while maintaining the integrity of the interior structure of the substrate of each circuit component during and after application of the breakage force. This is so because the multiple depthwise cracks that form in the substrate as a result of the application of the breakage force propagate depthwise through the thickness of the substrate in the region of high stress concentration rather than lengthwise throughout the interior structure of each piece of ceramic substrate. Formation of depthwise cracks in this manner facilitates cleaner fracture of the substrate to form multiple nominally identical circuit components.

The laser beam cutting process results in minimal resolidification of the substrate material, thereby decreasing the degree to which the side walls of the trench melt during application of the UV laser beam to form slag residue. The lack of significant resolidification and consequent formation of clearly defined trench side walls results in higher precision fracture of the substrate along the length of the scribe line because the nature of the laser beam weakens the substrate without disturbing the interior structure of the substrate.

Additional aspects and advantages of this invention will be apparent from the following detailed description of preferred embodiments thereof, which proceeds with reference to the accompanying drawings.

BRIEF DESCRIPTION OF THE DRAWINGS

FIGS. 3A and 3B are scanning electron micrographs showing at, respectively, 10× magnification and 65× magnification, cross sections of ceramic substrate pieces having microcracks extending through the interior of the substrate piece and formed using prior art $CO_2$ laser cutting.

DETAILED DESCRIPTION OF PREFERRED EMBODIMENTS

Figure 1:
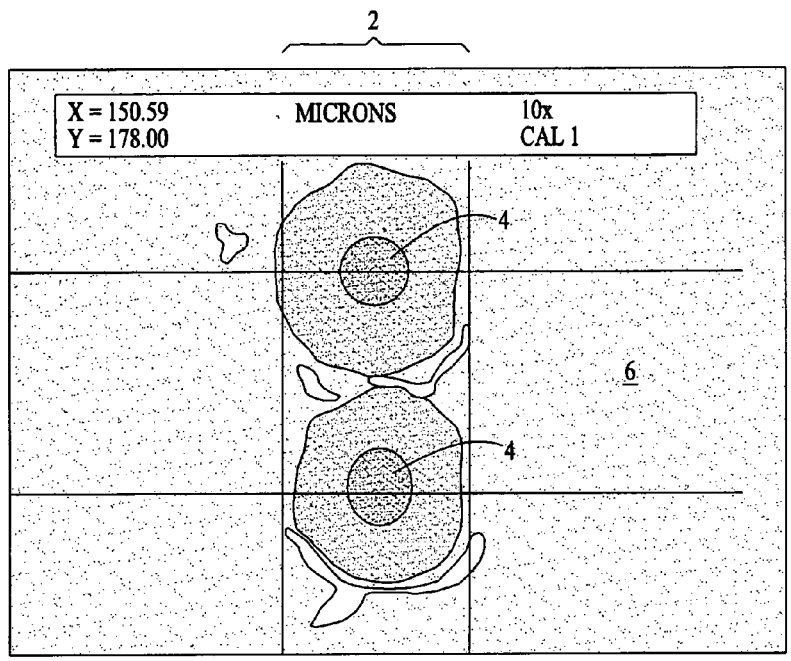
FIG. 1 is a scanning electron micrograph showing a top view of a post hole scribe line formed in a ceramic substrate using prior art $CO_2$ laser cutting.
Figure 2:
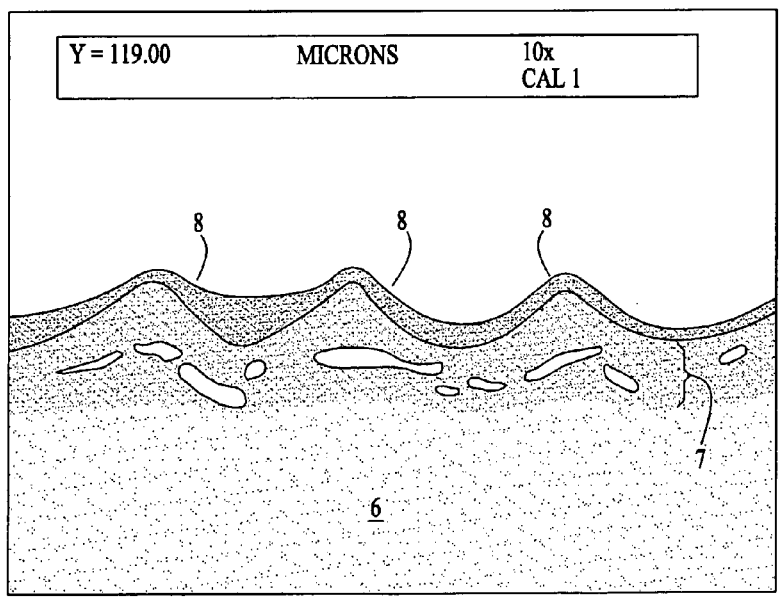
FIG. 2 is a scanning electron micrograph of a top view showing for a scribe line cut into a ceramic substrate the slag residue from $CO_2$ laser cutting and the jagged and uneven ceramic substrate side edge that was formed upon application of a breakage force on opposing sides of the post hole scribe line shown in FIG. 1.

The present invention entails directing a laser beam emitted by a solid-state ultraviolet laser to form a scribe line on a passive electronic component substrate. The preferred embodiments described are directed to substrates made of ceramic material; however, the process of forming a scribe line in a substrate may be carried out in substrates made of other suitable ceramic-like materials such as electronic ceramics, ceramic semiconductors, ceramic conductors, dielectrics, piezoelectrics, pyroelectrics, electro-optic ceramics, opto-electronic materials, magnetic ceramics (ferrites), glass ceramics, insulators and ceramic superconductors. In the preferred embodiments, the ceramic substrate absorbs the energy from the emitted laser beam, thereby effecting depthwise removal of a portion of the substrate to form a trench along the streets created by patterns formed on a surface or in the interior of the ceramic substrate as part of the process of forming the circuit components. Depending on the type of circuit components being fabricated, the patterns are typically formed by thick film processing (e.g., by screen printing for thick film resistors or multi-layer chip capacitors (MLCCs)) or by thin film processing (e.g., by vacuum deposition). The trench includes two side walls extending from the ceramic substrate surface and converging to form a clearly defined snap line at the bottom of the trench such that the trench has a cross section that is approximately triangular in shape (a wide opening and an apex). The depth of the trench is preferably sufficiently shallow such that the trench does not appreciably penetrate the thickness of the ceramic substrate, thereby minimizing the formation of microcracks extending in a direction generally perpendicular to the scribe line formed in the substrate and maintaining substrate structural integrity during fracture of the substrate. Further, the laser beam preferably has a wavelength that is sufficient to minimize resolidification of the substrate along the sidewalls of the scribe line.

A preferred laser for use in the method of the present invention is a Q-switched, diode-pumped, solid-state UV laser that includes a solid-state lasant, such as Nd:YAG, Nd:YLF, Nd:YAP, or Nd:YVO$_4$, or a YAG crystal doped with holmium or erbium. (A UV laser is defined as one that emits light having a wavelength of less than 400 nm.) UV lasers are preferred because (1) ceramic substrates exhibit strong absorption in the UV range; (2) UV laser scribing is fast because it does not require scribing both sides of the substrate; (3) since UV laser scribing is a largely non-thermal process, very sharp kerfs are created which produce clean and straight vertical breaks with tapers typically less than 3 degrees; (4) UV laser cutting removes metal exceptionally well (the cuts are clean with little to no material left in the kerf to hinder the break or de-lamination of the metal pads).

A preferred laser provides harmonically generated UV laser output of one or more laser pulses at a wavelength such as 355 nm (frequency tripled Nd:YAG) or 266 nm (frequency quadrupled Nd:YAG) with primarily a near TEM$_{00}$ spatial mode profile. Laser output having a wavelength of 355 nm is especially preferred because the crystals used to generate the third harmonic make available a higher power and a higher pulse repetition rate. The laser is preferably operated at a power of between about 0.5 W and about 10 W and a repetition rate of between about 15 kHz and about 100 kHz. The pulse width is preferably about 15 ns and about 100 ns, but can be any appropriate pulse width.

The UV laser pulses may be converted to expanded collimated pulses by a variety of well-known optical devices including beam expander or upcollimator lens components (with, for example, a 2× beam expansion factor) that are positioned along a laser beam path. A beam positioning system typically directs collimated pulses through an objective scan or cutting lens to a desired laser target position on the ceramic substrate.

The beam positioning systems incorporated in Model Series Nos. 4370 and 4420 small area micromachining systems manufactured by Electro Scientific Industries, Inc., Portland, Oreg., the assignee of this patent application, are suitable for implementing the present invention to scribe smaller (i.e., smaller than 10.2 cm×10.2 cm (4 in×4 in)) ceramic substrates. The beam positioning systems incorporated in Model Series Nos. 52xx and 53xx large area micromachining systems manufactured by Electro Scientific Industries, Inc. are suitable for implementing the present invention to scribe larger ceramic substrates (i.e., larger than 10.2 cm×10.2 cm (4 in×4 in)). Also, a compound beam positioning system, such as that described in U.S. Pat. No. 5,847,960, entitled MULTI-TOOL POSITIONING SYSTEM, and U.S. Pat. No. 5,754,585, entitled HIGH SPEED, HIGH ACCURACY MULTI-STAGE TOOL POSITIONING SYSTEM, both to Cutler et al. Some of these systems, which use an X-Y linear motor for moving the workpiece and an X-Y stage for moving the scan lens, are cost effective positioning systems for making long, straight cuts. Skilled persons will also appreciate that a system with a single X-Y stage for workpiece positioning with a fixed beam position and/or stationary galvanometer for beam positioning may alternatively be employed.

The method of the present invention can be used in connection with multiple laser systems operating under various parameters. Because the operating parameters of each specific laser system work in cooperation to form the clearly defined scribe line, the operational parameters can be tailored to the laser system, the substrate, or the manufacturing constraints. For example, a thick substrate may be effectively scribed according to the method of the present invention using any, or a combination, of the following operational parameters: a high power laser, a high repetition rate, multiple passes, or high energy per pulse. Conversely, a thinner substrate may be effectively scribed according to the method of the present invention using any, or a combination, of the following operational parameters: a low power laser, a low repetition rate, a single pass, or low energy per pulse.

Figure 4:
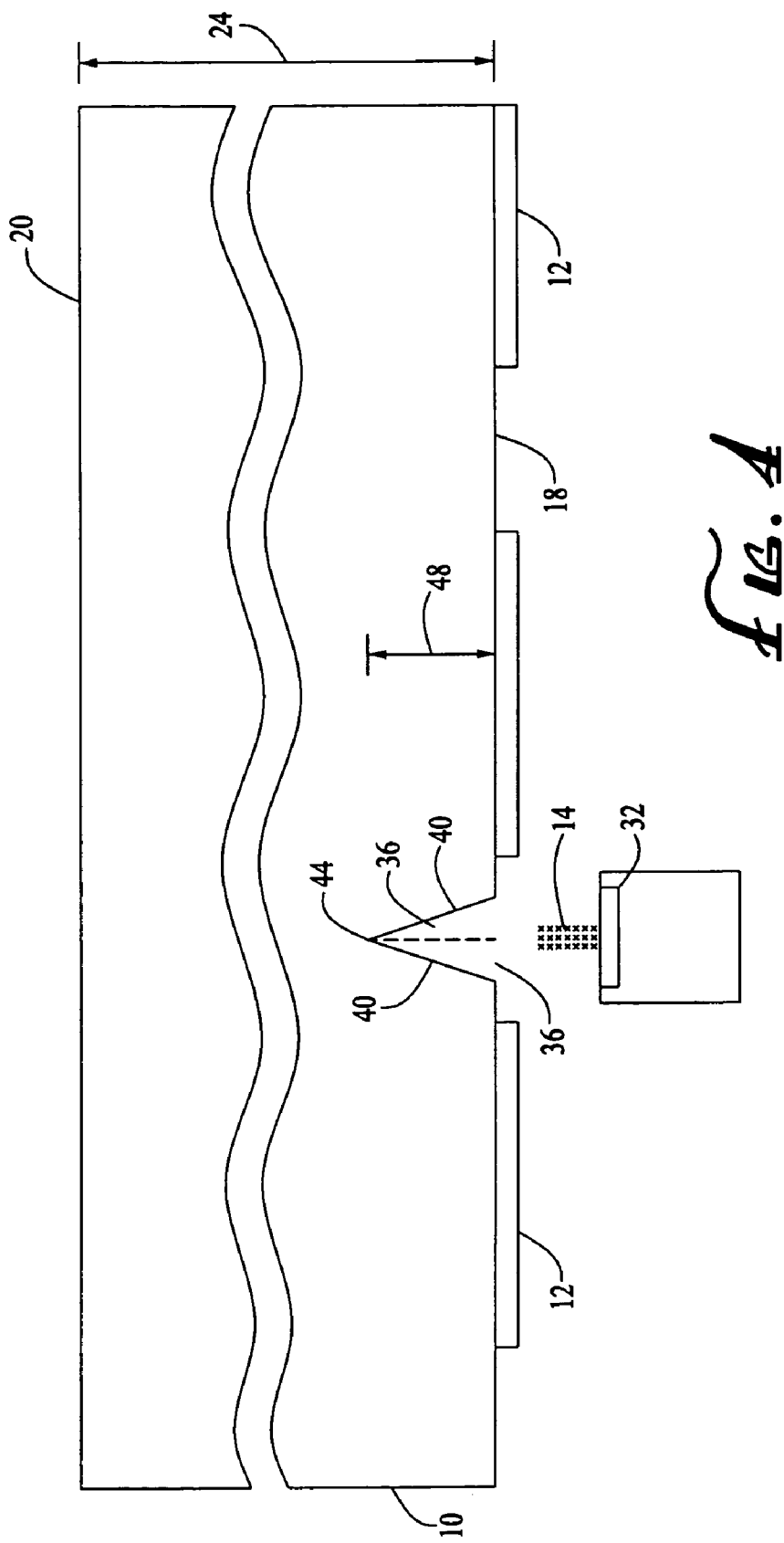
FIG. 4 is a pictorial schematic diagram of a laser scribe machine emitting a laser beam that impinges a ceramic substrate surface to form a scribe line in accordance with the present invention.
Figure 5A:
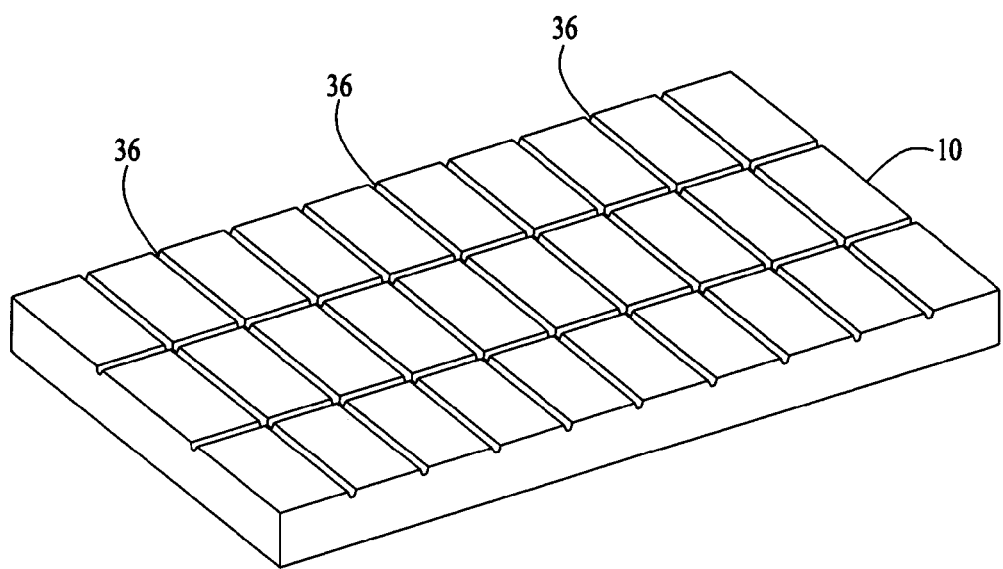
FIG. 5A is a schematic diagram of a passive electronic component substrate for use as a chip capacitor that has been scribed on only one surface.

FIG. 4 shows one exemplary passive electronic component substrate, a ceramic substrate 10, onto which a laser beam 14 is aimed. Ceramic substrate 10 includes a first surface 18 and a second surface 20 that define between them a substrate thickness 24. Ceramic substrate 10 also includes a street 28 (shown in FIG. 6) and multiple electronic components 12, e.g. resistors, that have been affixed on one of first substrate surface 18 or second substrate surface 20. The scribing method of the present invention can be performed on either side of ceramic substrate 10 or both sides of ceramic substrate 10. Single-sided substrate scribing (shown in FIG. 5A) is preferred when scribing chip resistor substrates, and double-sided substrate scribing (shown in FIG. 5B) is preferred when scribing chip capacitor substrates.

A laser scribe machine including a laser 32 is aligned with street 28 using a beam positioning system as described above. The portion of ceramic substrate 10 coextensive with street 28 is then ablated to form a trench 36. Trench 36 may be formed by a single pass or multiple passes of laser beam 14, depending on the operational parameters of the laser system, the thickness, density, and type of ceramic substrate being scribed, and any manufacturing constraints. The length of trench 36 typically runs the entire usable length or width of the ceramic substrate surface. Trench 36 includes a trench length that is preferably coextensive with street 28 and a trench width that is preferably less than about 30 μm and more preferably between about 20 μm and about 30 μm, as established by the laser beam spot size.

Figure 6:
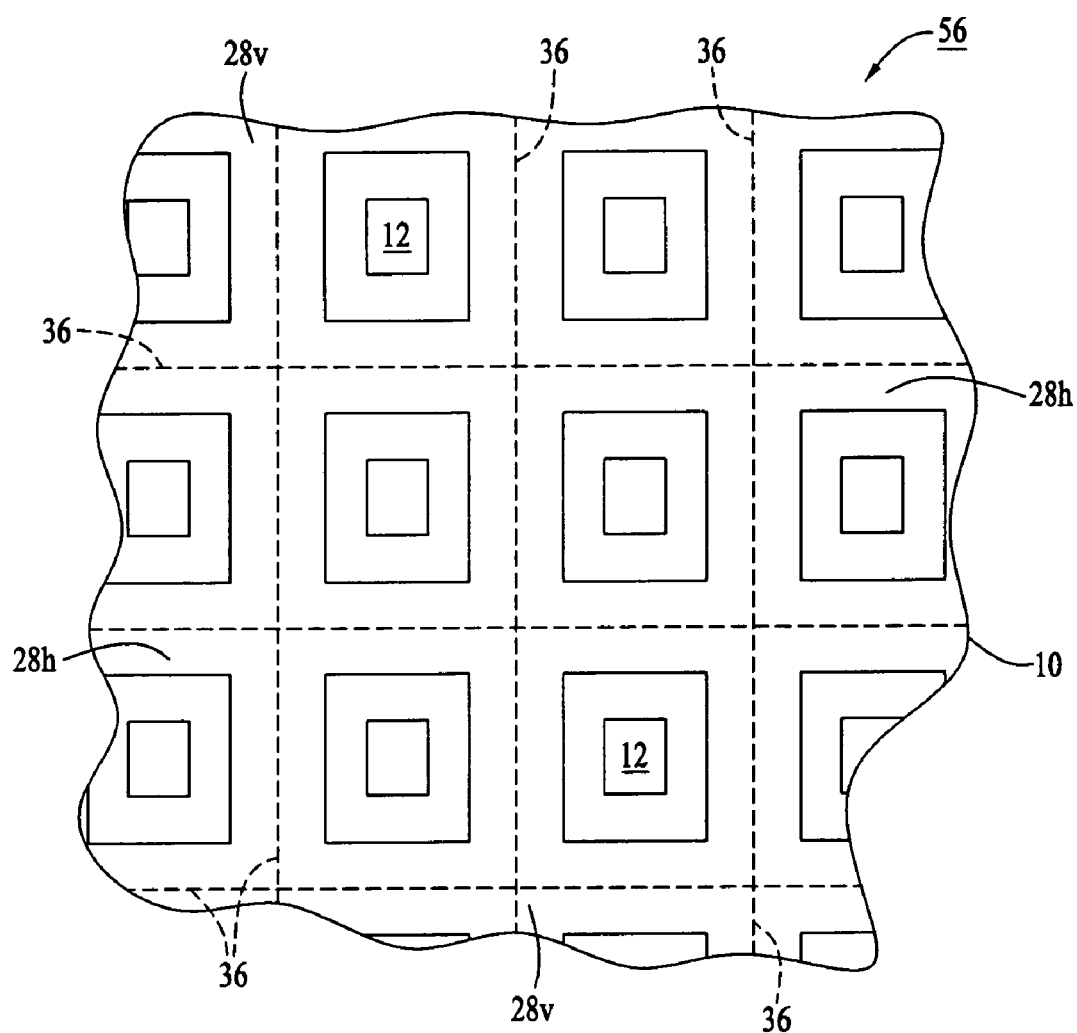
FIG. 6 is a top view of a scribe grid composed of multiple streets on the surface of a ceramic substrate onto which have been affixed multiple electronic components, such as resistors, along which the scribe line may be formed in accordance with the present invention.

Multiple trenches may be created along streets 28 to form a grid on the ceramic substrate surface as shown in FIG. 6. The multiple trenches may be formed in any of the ways commonly known to those skilled in the art, including scribing one scribe line with multiple passes before scribing additional scribe lines, scribing each scribe line in the grid with a first pass before scribing each line with additional passes, and scribing using an alternate pattern approach. (An example of alternate pattern scribing would be, for a set of multiple streets arranged side-by-side lengthwise, forming scribe lines in alternating sequence along streets from two nonoverlapping subsets of the streets in the set.) Because ceramic substrates retain heat, the preferred method of scribing grids having a tight pitch (grids in which adjacent scribe lines are positioned less than 400 microns apart) involves scribing, in an alternate pattern, each individual scribe line with a first pass before scribing each line with additional passes. The time elapsed between the first and second passes for each scribe line facilitates heat dissipation and thereby minimizes the incidence of heat build-up-based chipping and cracking of the ceramic substrate.

Trench 36 further includes two inclined side walls 40 extending from the ceramic substrate surface 18 and converging to form a clearly defined snap line 44 at the bottom of trench 36 such that it has a cross section that is approximately triangular in shape (a wide opening and an apex 44). In FIG. 4, trench 36 has a trench depth 48 extending from either first surface 18 (FIG. 4) or second surface 20 of ceramic substrate 10 to the bottom of trench 36 where the two side walls 40 converge to form snap line 44 having a high stress concentration. Trench depth 48 is preferably sufficiently shallow such that trench 36 does not appreciably penetrate ceramic substrate thickness 24, thereby minimizing the formation of microcracks extending perpendicular to the scribe line. Trench depth 48 is dependent on the circuit size and substrate thickness and is preferably between about 5% and 40% of substrate thickness 24. Trench depth 48 can be controlled by selecting the appropriate power setting and duration of application for laser beam 14. Optimal scribe line depth is dependent on the substrate material(s) into which the scribe line is formed. Thus the optimal value will be established by the properties of each substrate material and each set of laser operating parameters.

Ceramic substrate 10 is then broken into multiple pieces by application of a tensile breakage force perpendicular to the scribe line. Trench 36 preferably has a triangular cross-sectional shape such that the application of a breakage force on both sides of trench 36 causes ceramic substrate 10 to cleanly break along snap line 44. The resulting multiple circuit components include side margins, portions of which were originally trench side walls 40.

A plurality of trenches 36 may be formed on ceramic substrate 10 using the method of the present invention. One exemplary method by which a plurality of circuit components can be made is shown in FIG. 6, showing a scribe grid 56 on a surface of ceramic substrate 10. Scribe grid 56 includes horizontal (x-axis) 28h and vertical (y-axis) 28v streets that define an array of separate regions, each corresponding to an individual circuit component. Scribe grid 56 also includes trenches 36 that are coextensive with horizontal (x-axis) 28h and vertical (y-axis) 28v streets.

Figure 11:
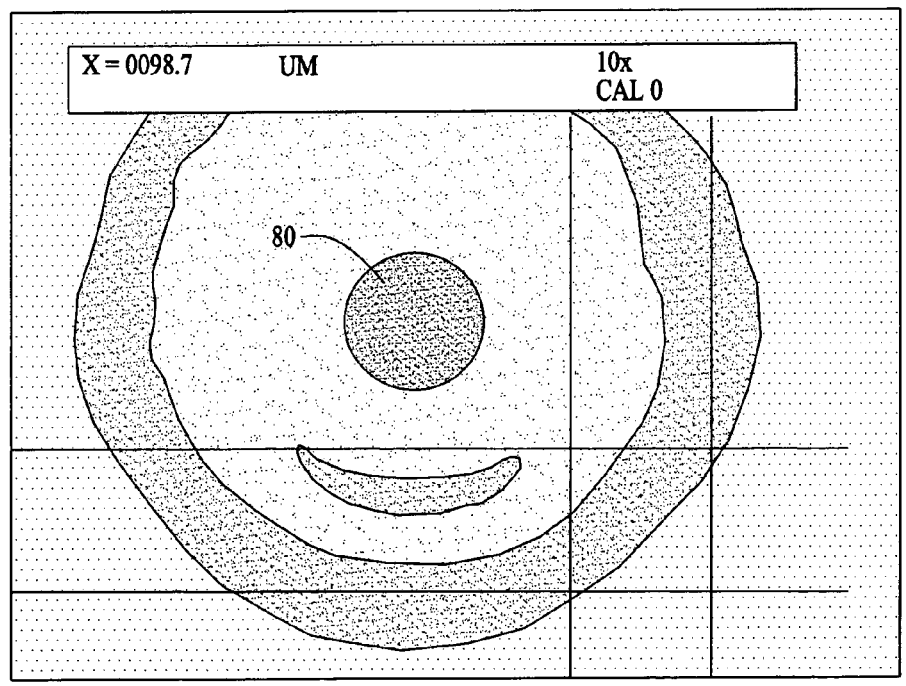
FIG. 11 is a scanning electron micrograph of an alignment hole formed in a ceramic substrate.

Instead of, or in addition to, covering with a sacrificial layer the ceramic substrate surface that will be impinged by laser beam 14, as is well known to persons skilled in the art, laser cutting may be performed from the backside 20 of the ceramic surface so that laser-generated debris becomes irrelevant. Backside alignment can be accomplished with laser or other markings or alignment through-holes made from front side 18 of ceramic substrate 10. An exemplary alignment hole is shown in FIG. 11. Alternatively, backside alignment can be accomplished using edge alignment and/or calibration with a camera view, as are known to persons skilled in the art.

The following examples demonstrate exemplary lasers and operational parameters that cooperate to effect the depthwise removal of fired and green (unfired) ceramic substrate materials to form the clearly defined, snap line of the present invention.

EXAMPLE 1

Lower Power, Higher Repetition Rate Micromachining

A scribe line was formed on a fired ceramic substrate material having a thickness of 0.913 mm using a Model No. V03 laser, manufactured by LightWave Electronics of Mountain View, Calif., emitting a 25 micron Gaussian beam and positioned in a Model No. 5200 laser system, manufactured by Electro Scientific Industries. The process was run at an effective rate of 0.5 mm/s (actual rate=25 mm/s/repetitions). The operational parameters used are listed in Table I.

TABLE I

| Operational Parameters. | |
| --- | --- |
| PRF | 3 kHz |
| Avg. Power | 1.4 W |
| Min. Power | 1.4 W |
| Max. Power | 1.4 W |
| Wavelength | 355 nm |
| Stability* | 100% |
| Energy/Pulse | 466.7 uJ |
| Fluence | 95 J/cm$^2$ |
| Speed | 25 mm/s |
| Bite Size | 8.33 microns |
| Spot Diameter | 25 microns |
| No. of Repetitions+ | 1 to 50 |

*stability is a measure of pulse-to-pulse laser stability.

+Repetitions are the number of passes the laser beam makes over a specific area.

Following formation of the scribe line, the ceramic material was broken along the line to form two singulated circuit components that were examined with a light microscope to evaluate cut quality, depth, and features. The circuit component side edges were clean and had no debris. The walls of the cut were slightly tapered due to the Gaussian beam profile. Overall, the process produced a clean cut having good edges and a clean break. Data relating to the depth of the cut vs. the number of repetitions and the percentage of cut (cut/total thickness of the fired ceramic material) are shown in Table II, which suggests that multiple repetitions are preferred when using these operational parameters.

TABLE II

| Test Results for Depth of Cut, Percent Cut, and Depth per Pass | | | |
| --- | --- | --- | --- |
| Pass | Depth of Cut (mm) | Percent Cut | Depth per Pass (mm) |
| 4 | 0.014 | 1.53% | 0.014 |
| 5 | 0.017 | 1.86% | 0.003 |
| 6 | 0.023 | 2.52% | 0.006 |
| 7 | 0.029 | 3.18% | 0.006 |
| 8 | 0.029 | 3.18% | 0 |
| 9 | 0.031 | 3.40% | 0.002 |
| 10 | 0.032 | 3.50% | 0.001 |
| 11 | 0.038 | 4.16% | 0.006 |
| 12 | 0.038 | 4.16% | 0 |
| 13 | 0.046 | 5.04% | 0.008 |
| 25 | 0.08 | 8.76% | 0.034 |
| 50 | 0.165 | 18.07% | 0.085 |

EXAMPLE 2

Higher Power, Lower Repetition Rate Micromachining

A scribe line was formed on a fired ceramic substrate material having a thickness of 0.962 mm using a Model No. Q301 laser, manufactured by LightWave Electronics of Mountain View, Calif., emitting a 25 micron Gaussian beam and positioned in a Model No. 5200 laser system, manufactured by Electro Scientific Industries. The operational parameters used are listed in Table III.

TABLE III

| Operational Parameters | |
| --- | --- |
| PRF | 15 kHz |
| Avg. Power | 7.27 W |
| Min. Power | 7.25 W |
| Max. Power | 7.29 W |
| Wavelength | 355 nm |
| Stability* | 99.3% |
| Energy/Pulse | 484.7 uJ |
| Fluence | 98.7 J/cm$^2$ |

*Stability is a measure of pulse-to-pulse laser stability.

Three separate trials were performed at varying speeds and bite sizes as indicated in Tables IV, V, and VI.

TABLE IV

| Trial #1 | |
| --- | --- |
| Speed | 25 mm/s |
| Bite Size | 1.667 microns |

TABLE IV-continued

Trial #1

| | |
|---|---|
| Spot Diameter | 25 microns |
| No. of Repetitions | 1 to 2 |
| Effective Speed | 12.5 mm/s |

TABLE V

Trial #2

| | |
|---|---|
| Speed | 50 mm/s |
| Bite Size | 3.33 microns |
| Spot Diameter | 25 microns |
| No. of Repetitions | 2 |
| Effective Speed | 25 mm/s |

TABLE VI

Trial #3

| | |
|---|---|
| Speed | 100 mm/s |
| Bite Size | 6.66 microns |
| Spot Diameter | 25 microns |
| No. of Repetitions | 3 |
| Effective Speed | 33 mm/s |

Following formation of each scribe line, the ceramic material was broken along the line to form two singulated circuit components that were examined with a light microscope to evaluate cut quality, depth, and features. The edge break areas on the scribed circuit components formed by lasers scribing at speeds of 50 mm/s and 100 mm/s produced very clean edges along the snap line. An edge taper of approximately 20 microns was seen on the edges, which may be attributed to a scribe line width of approximately 45 microns.

Data regarding the depth of cut vs. the number of repetitions (passes) for each of the three trials described in Tables IV to VI are shown in Table VII.

TABLE VII

Depth of Cut per Repetition for Lasers Operating at Speeds of 25 mm/s, 50 mm/s, and 100 mm/s.

| Pass | Depth of Cut (mm) | Percent Cut | Depth per Pass (mm) |
|---|---|---|---|
| | 25 mm/s | | |
| 1 | 0.019 | 1.98% | 0.019 |
| 2 | 0.027 | 2.81% | 0.008 |
| 3 | 0.038 | 3.95% | 0.011 |

TABLE VII-continued

Depth of Cut per Repetition for Lasers Operating at Speeds of 25 mm/s, 50 mm/s, and 100 mm/s.

| Pass | Depth of Cut (mm) | Percent Cut | Depth per Pass (mm) |
|---|---|---|---|
| | 50 mm/s | | |
| 1 | 0.014 | 1.46% | 0.014 |
| 2 | 0.017 | 1.77% | 0.003 |
| 3 | 0.023 | 2.39% | 0.006 |
| | 100 mm/s | | |
| 1 | 0.01 | 1.04% | 0.01 |
| 2 | 0.021 | 2.18% | 0.011 |

A comparison of Tables II and VII shows that the increased power used in Example 2 results in an increased ceramic material removal rate. Consequently, a higher power per pulse laser system operating at a higher repetition rate is preferred.

EXAMPLE 3

Higher Power, Lower Repetition Rate Micromachining

A scribe line was formed on a fired ceramic substrate material having a thickness of approximately 100 microns using a Model No. Q302 laser, manufactured by LightWave Electronics of Mountain View, Calif., emitting a 25 micron Gaussian beam and positioned in a Model No. 5200 laser system, manufactured by Electro Scientific Industries. The operational parameters used are listed in Table VIII.

TABLE VIII

Operational Parameters

| Wavelength (nm) | Avg. Power (W) | Repetition Rate (kHz) | Energy/Pulse (μJ) | No. of Repetitions | Pulse Width (ns) | Max. Power (kw) | Effective Spot Diameter (μm) | Fluence (J/cm$^2$) |
|---|---|---|---|---|---|---|---|---|
| 355 | 3.9 | 50 | 78 | 1 | 25 | 3.12 | 30 | 1.10 |

The laser beam was moved at a programmed speed of 100 mm/s and an effective speed of 50 mm/s. The total depth of the scribe line was approximately 28 microns. Because the bite size was approximately 2 microns, there was significant overlap in each of two passes. Following formation of the scribe line, the ceramic material was broken along the line to form two singulated circuit components that were examined with a light microscope to evaluate cut quality, depth, and features. The edge break areas on the scribed circuit components lacked significant slag residue.

EXAMPLE 4

UV Laser Scribing of a Green Ceramic Substrate

A scribe line was formed in a green (unfired) MLCC substrate having a thickness of 800 μm using a Model No.

Q301 laser, manufactured by LightWave Electronics, emitting a 25 micron Gaussian beam that was positioned in a Model No. 4420 laser system, manufactured by Electro Scientific Industries. The operational parameters used are listed in Table IX.

TABLE IX

Operational Parameters

| Wavelength (nm) | Avg. Power (W) | Repetition Rate (kHz) | Repetition Rate (kHz) | No. of Repetitions | Bite Size (um) | Beam Speed (mm/s) | Cut Depth (um) | Lens |
|---|---|---|---|---|---|---|---|---|
| 355 | 8.1 | 10 | 10 | 5–10 | 5 | 50 | 60 | 25 mm |

Figure 9:
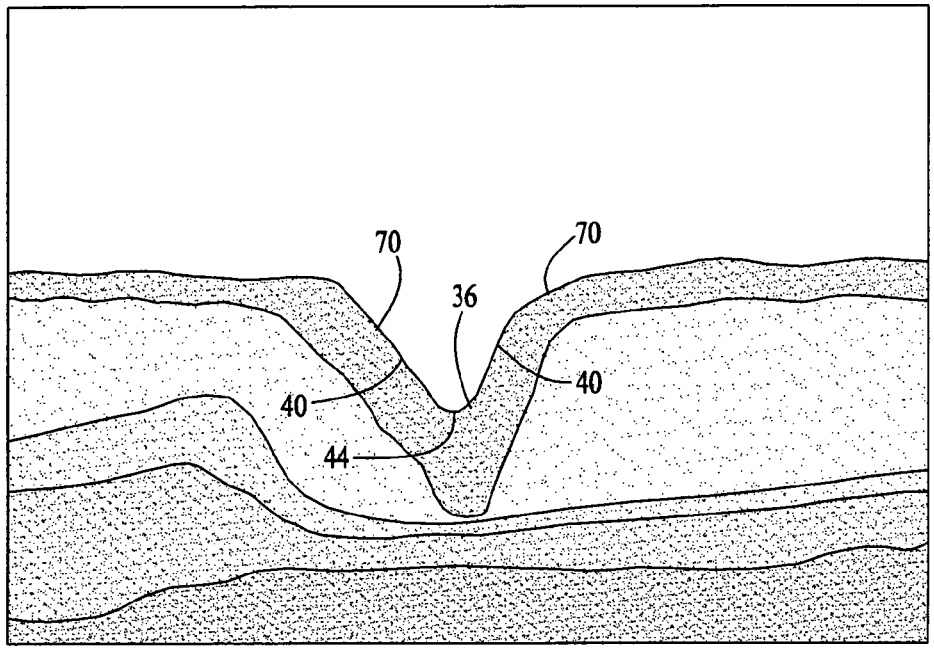
FIG. 9 is a scanning electron micrograph showing a side view of a scribe line formed in a green (unfired) ceramic substrate.

FIG. 9 is a scanning electron micrograph showing a side view of a scribe line that was formed in the green (unfired) MLCC substrate. As shown in FIG. 9, the trench has clearly defined side walls that converge to form a sharp snap line. The cross-sectional shape of the trench is triangular.

Following formation of the scribe line, the green MLCC substrate is fired. Firing of the substrate plate results in shrinkage of the substrate. Ceramic substrates typically undergo between about 10% and about 20% shrinkage, dependent on numerous variables, such as particle size, particle shape, distribution of dielectric and internal electrode metal powders, green density of the substrate, method and operating parameters used to form the plate (e.g., tape casting or screen printing), and dielectric formulation composition. The applicants have found that the effective kerf depth of the scribe line increases when the MLCC substrate is fired.

Figure 10:
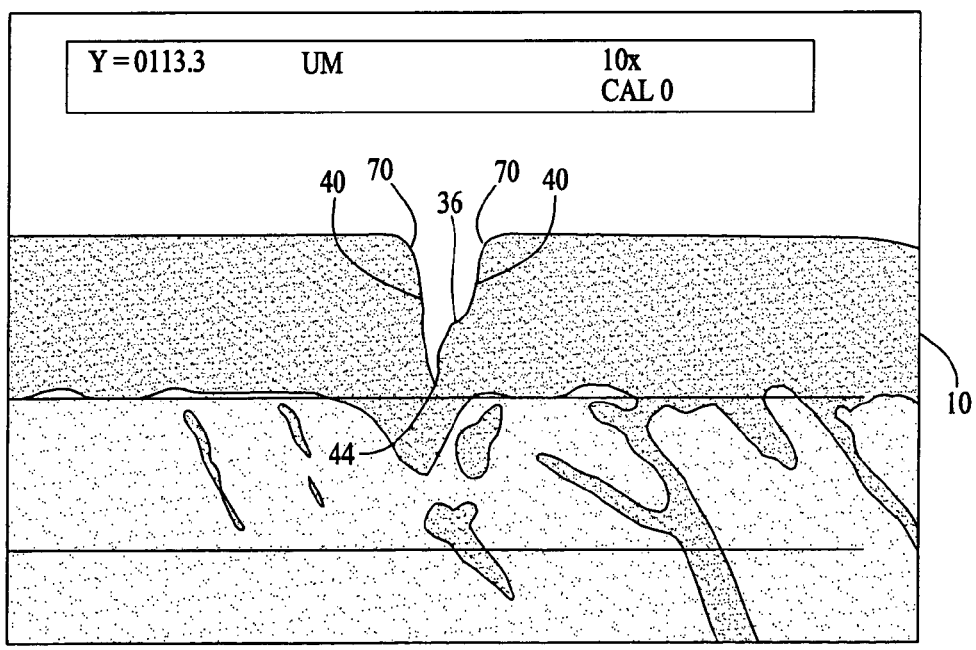
FIG. 10 is a scanning electron micrograph of the side margins of a singulated chip capacitor formed on the ceramic substrate of FIG. 9.

Following formation of the scribe line and firing of the substrate, the MLCC material was broken along the scribe line to form multiple rows of circuit components (e.g., chip capacitors) that were examined with an optical microscope to evaluate cut quality, depth, and features. FIG. 10 shows in the plane of the figure the side margins of a row of chip capacitors. The chip capacitor side edges were clean and had no debris. Overall, the process produced a clean cut having good edges and a clean break. One advantage of scribing green ceramic substrates is that deeper scribe lines can be formed in green ceramic material because it is softer.

When forming chip capacitors, the ceramic substrate is preferably scribed on both of the first and second substrate surfaces such that the scribe line on the first surface is spatially aligned with the scribe line on the second surface. This double-sided scribing is effected as follows: (1) alignment holes are drilled into the substrate, (2) a scribe line is formed on the first surface using the above-described method, (3) the substrate is flipped over and re-aligned using the alignment holes, (4) a scribe line is formed on the second surface using the above-described method such that the scribe line on the second surface is spatially aligned with the scribe line on the first surface.

Multiple alignment holes are typically formed in the corners of the substrate to facilitate alignment of the substrate when it is flipped over and the second surface is scribed. An exemplary alignment hole 80 is shown in FIG. 11. Alignment hole 80 of FIG. 11 was formed on a green (unfired) MLCC substrate having a thickness of 800 μm using a Model No. Q301 laser, manufactured by Lightwave Electronics, emitting a 25 micron Gaussian beam and positioned in a Model No. 4420 laser system, manufactured by Electro Scientific Industries. The operational parameters used are listed in Table X.

TABLE X

Operating Parameters.

| Power Level (W) | Bite Size (um) | Beam Speed (mm/s) | Repetition Rate (kHz) |
|---|---|---|---|
| 8.1 | 3 um | 30 | 10 |

Alternative alignment methods, as described above, may be used in connection with the formation of a scribe line on green material.

Figure 5B:
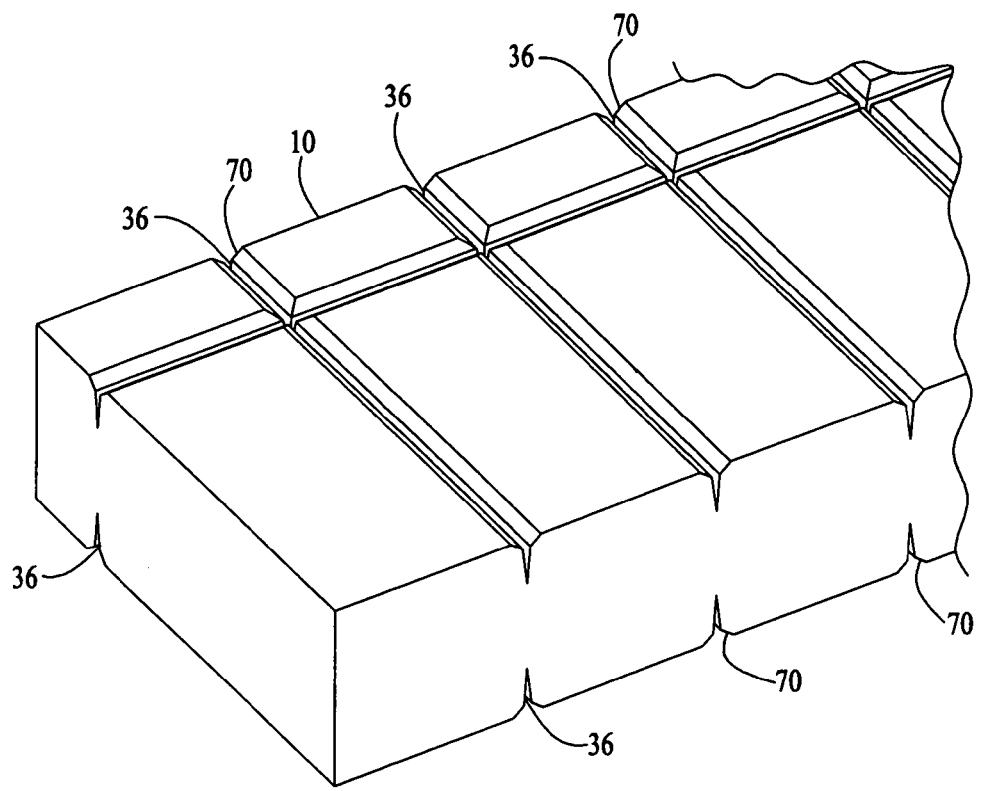
FIG. 5B is a schematic diagram of a passive electronic component substrate for use as a chip capacitor that has been scribed on both surfaces.

When the singulated circuit components form chip capacitors, edges 70 of trench 36 formed in substrate 10 are preferably edge rounded (as shown in FIGS. 5B, 9, and 10). More specifically, side walls 40 meet first substrate surface 18 to form edges 70 at first substrate surface 18 of substrate 10. It is the industry standard for these edges to be rounded. Edge rounding is performed for two main reasons: (1) to round off the edges of the chips which represent the primary source of mechanical stress concentration at the sharp regions, thereby lowering the stress concentration in the edges and lessening the chance of the termination coating chipping during processing and/or handling and exposing the internal electrodes, and (2) facilitating uniform end termination chip coverage at the edges. Such rounding is effected by directing the ultraviolet laser beam to remove substrate material at the edges to impart curved shapes to them. Exemplary specifications for edge rounding are: an apex-to-side ratio of <3 um and corner coverage of <20 um.

Examples 1–4 show that the formation of a region of high stress concentration facilitates higher precision fracture of the ceramic substrate such that the interior integrity of each resulting ceramic substrate piece remains substantially unchanged during and after application of the breakage force. The ceramic substrate interior remains intact because the multiple depthwise cracks that form in the ceramic substrate as a result of the application of the breakage force propagate depthwise through the thickness of the ceramic substrate in the region of high stress concentration rather than lengthwise throughout the interior structure of each piece of ceramic substrate. This facilitates cleaner fracture of the ceramic substrate into multiple circuit components.

Figure 7:
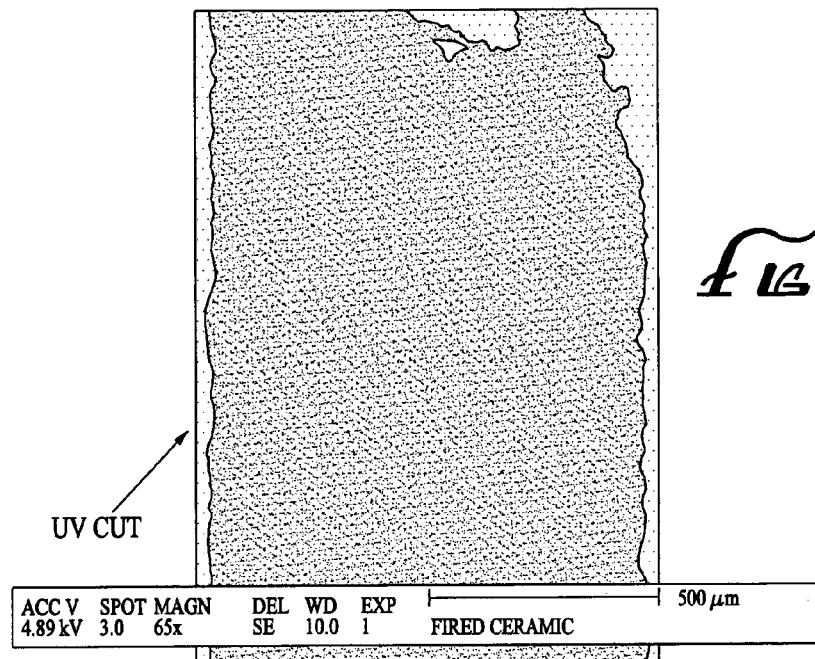
FIG. 7 is a scanning electron micrograph showing at 65× magnification the smooth and even side edges of a ceramic substrate piece scribed in accordance with the present invention.

Also, the operating parameters of the laser beam minimize the incidence of resolidification of the ceramic substrate material, decreasing the degree to which the side walls of the trench melt during application of the laser beam and thereby minimizing the formation of slag residue. Specifically, the laser scribe method of the present invention causes absorption of most of the laser energy by the portion of the ceramic substrate thickness removed by the laser pulse. Such energy absorption ensures that virtually no heat is left behind to cause melting of the sidewalls of the trench. The lack of significant resolidification and consequent clearly defined trench side walls results in higher precision fracture of the ceramic substrate along the scribe line because the ablative (non-thermal) nature of the laser beam weakens the ceramic substrate without disturbing the interior structure of the ceramic substrate. The minimal resolidification also results in superior and consistent edge quality; the smoother edges eliminate points of weakness from which microcracks may originate. FIG. 7 is a SEM showing at 65× magnification the smooth and even side edges of a ceramic substrate piece that was scribed in accordance with the method of the present invention.

One benefit of UV laser cutting is that it consumes significantly less material (kerfs of less than 50 μm wide and preferably less than 30 μm wide) than does mechanical cutting (slicing lanes of about 300 μm and dicing paths of about 150 μm) so that more circuit components can be manufactured on a single substrate.

The method of the present invention also facilitates scribing a substrate having an irregular shape that required off-axis alignment of the substrate and the laser beam. Specifically, the method of the present invention can be used to form off-axis scribe lines positioned at azimuthal angles relative to the normal. When forming a scribe line on non-orthogonal or offset patterns, inspection of the passive electronic component substrate at various points may be required. One exemplary beam positioning system for use in scribing this type of passive electronic component is the beam positioning system in a Model 4420 or 4370 UV-YAG Laser Scribing System manufactured by Electro Scientific Industries, of Portland, Oreg., the assignee of the present application.

Figure 8:
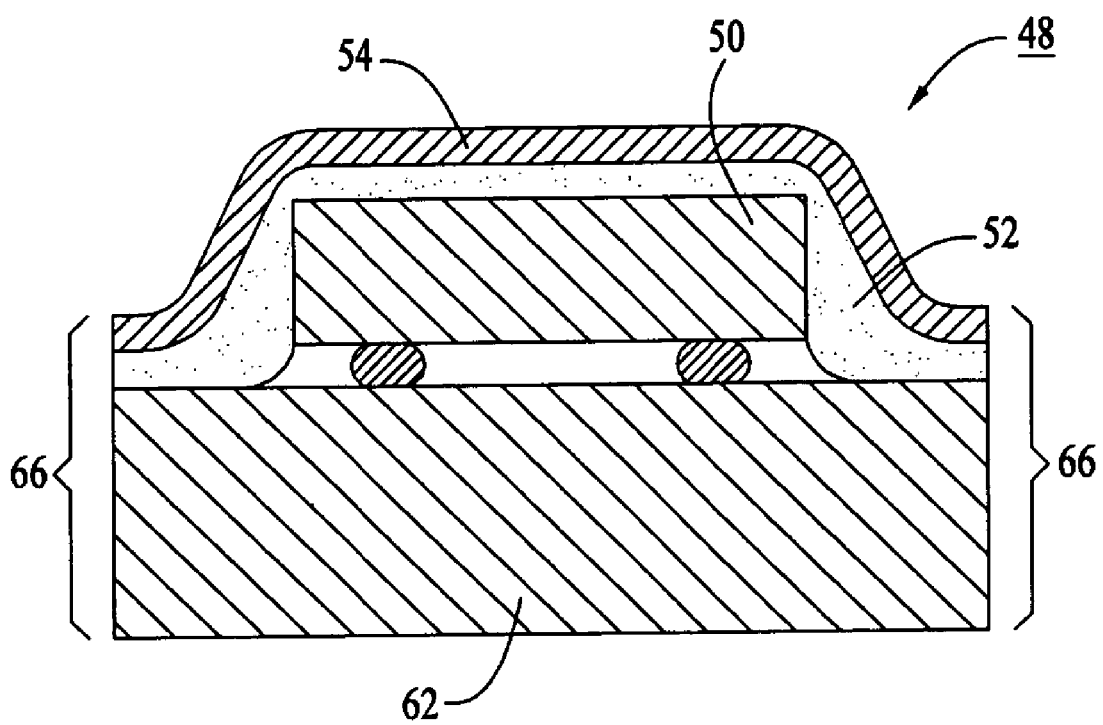
FIG. 8 is a side view, pictorial schematic diagram of a ceramic filter including a top metal layer that has been scribed using the method of the present invention.

Further, multi-layer ceramic components, such as MLCCs including a copper, silver, or nickel layer, can be scribed using the method of the present invention without destroying the integrity of the other layers. In one embodiment, the green layers of a ceramic filter 49 may be stacked and then the resulting ceramic filter structure may be fired. As shown in FIG. 8, ceramic filter 48 may include a chip 50 that is coated with a laminate 52 and a copper, silver, or nickel hermetic coating 54. Chip 50 sits atop a ceramic substrate 62. Prior art methods of mechanically sawing through copper hermetic coating 54 unacceptably damaged laminate 52. Also, due to the ductile nature of copper, mechanically sawing the top layer is unacceptably slow. The method of the present invention allows copper hermetic layer 54 of ceramic filter 48 to be cut with a UV laser beam having an energy and spot size sufficient to singulate copper hermetic coating 54 and ceramic substrate 62 without damaging laminate 52. The UV laser used in connection with the method of the present invention may be programmed to cut through copper hermetic coating 54 and to leave in ceramic substrate 62 a trench having a snap line along which ceramic substrate 62 may be singulated into separate, nominally identical circuit components. Alternatively, the UV laser used in connection with the method of the present invention may be programmed to cut through copper hermetic coating 54 without affecting ceramic substrate 62. The laser may then be reprogrammed to have an energy and spot size sufficient to form a scribe line in accordance with the method of the present invention along which ceramic substrate 62 may be singulated into separate, nominally identical circuit components.

In summary, the method of the present invention can be used to form scribe lines in various types of passive electronic component substrates and singulated to form various electronic components. A list of exemplary electronic components includes chip resistors; chip capacitors; inductors; filters; varistors (including, but not limited to, metal oxide varistors, multilayer varistors, and disc varistors); thermistors; electronic components based on magnetic materials such as ferrite beads and transformers; electronic components based on piezoelectric ceramics such as transducers and sensors; electronic components based on opto-electronic ceramics such as optical switches and color filters; and LTCC and HTCC packages.

Lastly, ceramic substrates having metal-laden streets extending along either, or both, of the x- and y-axis may similarly be singulated using the method of the present invention.

It will be obvious to those having skill in the art that many changes may be made to the details of the above-described embodiment of this invention without departing from the underlying principles thereof. The scope of the present invention should, therefore, be determined only by the following claims.

The invention claimed is:

1. A method of forming in a passive electronic component substrate a scribe line that facilitates breakage of the substrate into separate pieces having side margins defined by the scribe line, the substrate having a thickness and a surface on which is formed a pattern of multiple nominally identical, mutually spaced apart electronic components, the electronic components separated by streets along one of which the scribe line is formed such that the separate pieces created by breakage of the substrate comprise separate circuit components, the method comprising:

providing the substrate in a green condition;

aligning an ultraviolet laser beam characterized by an energy and a spot size with one of the streets on the surface of the substrate;

imparting relative motion between the ultraviolet laser beam and the substrate in the green condition such that the laser beam is directed lengthwise along the street and effects depthwise removal of substrate material to form a trench, the energy and spot size of the ultraviolet laser beam effecting the depthwise removal in the absence of appreciable melting of the substrate material so that the trench formed in the substrate material has a width that converges from the surface to a trench bottom in the form of a sharp snap line; and thermally processing the substrate to a fired condition, the shape of the trench forming a region of high stress concentration extending into the thickness of the substrate and along the snap line so that, after application of a breakage force to either side of the trench, there is clean breakage of the substrate in the fired condition into separate electronic components.

2. The method of claim 1, in which the substrate includes a ceramic or ceramic-like material.

3. The method of claim 1, in which the substrate is formed of a single layer of ceramic or ceramic-like material.

4. The method of claim 1, in which the substrate is formed of multiple layers of ceramic or ceramic-like material.

5. The method of claim 1, in which the surface is a first surface and the substrate further comprises a second surface, and in which the trench constitutes a first trench formed in the substrate material through the first surface; and further comprising repeating the aligning of an ultraviolet laser beam and the imparting of relative motion between the ultraviolet laser beam and the substrate in the green condition to form a second trench in the substrate material through the second surface such that the first and second trenches are spatially aligned.

6. The method of claim 5, in which the substrate includes multiple alignment holes that facilitate the spatial alignment of the first and second trenches in their formation process.

7. The method of claim 1, in which the trench includes first and second inclined side walls that converge to form the snap line at the bottom of the trench and that meet the substrate surface to form edges at the surface, and further comprising directing to the substrate in the green condition the ultraviolet laser beam to remove substrate material at the edges to impart curved shapes to them.

8. The method of claim 1, in which the electronic components are selected from the group consisting essentially of resistors, capacitors, inductors, filters, varistors, thermistors, ferrite beads, transformers, transducers, actuators, sensors, optical switches, and color filters.

9. The method of claim 1, in which a cross-section of the trench is of generally triangular-shape.

10. The method of claim 1, in which the snap line is formed at a depth that is between about 5% and 40% of the substrate thickness.

11. The method of claim 1, in which the surface is a first surface and the substrate further includes a second surface, and in which one of first and second surfaces has printed on it a pattern that facilitates the alignment of the street and the ultraviolet laser beam as it moves lengthwise along the street.

12. The method of claim 1, in which the substrate includes first and second opposite side margins, and in which the streets intersect the first and second side margins at oblique angles.

13. The method of claim 12, in which the substrate is of generally rectangular shape.

14. The method of claim 1, further comprising repeating the aligning of an ultraviolet laser beam and the imparting of relative motion between the ultraviolet laser beam and the substrate in the green condition to form multiple trenches in the substrate material.

15. The method of claim 1, in which the imparting relative motion to form the trench is performed in one lengthwise pass along the street.

16. The method of claim 1, in which the imparting relative motion to form the trench is performed in multiple lengthwise passes along the street.

17. The method of claim 1, in which the laser beam is emitted by a pulsed UV-YAG laser operating at a repetition rate of between about 15 kHz and about 100 kHz.

18. The method of claim 1, in which the laser beam is emitted by a pulsed UV-YAG laser operating at an energy per pulse of between about 50 µJ and about 1000 µJ.

19. The method of claim 1, in which the laser beam is emitted by a laser operating at a power of between about 0.5 W and about 10 W.

20. The method of claim 1, in which the trench has a width that is less than about 30 microns.

21. The method of claim 1, in which the laser beam has a spot size that is less than about 30 microns.

22. The method of claim 1, in which the surface is a first surface and the substrate further comprises a second surface and one of the first and second surfaces is at least partly coated with a layer of metal.

23. The method of claim 22, in which the metal layer includes copper, silvery or nickel.

24. The method of claim 1, in which at least one of the streets includes a metal layer.

* * * * *